United States Patent
Kurihara et al.

[11] Patent Number: 5,888,843
[45] Date of Patent: Mar. 30, 1999

[54] METHOD FOR MAKING LIGHT-EMITTING DIODE HAVING IMPROVED MOISTURE RESISTANCE CHARACTERISTICS

[75] Inventors: Tooru Kurihara; Toshiya Toyoshima; Seiji Mizuniwa; Masahiro Noguchi, all of Ibaraki-ken, Japan

[73] Assignee: Hitachi Cable, Ltd., Tokyo, Japan

[21] Appl. No.: 766,867

[22] Filed: Dec. 13, 1996

[51] Int. Cl.⁶ .................................................. H01L 21/00
[52] U.S. Cl. ............................... 438/46; 438/47; 438/94; 438/557; 148/DIG. 72
[58] Field of Search ............................ 438/22, 46, 47, 438/94, 542, 557, 157, 286, 287, 319; 148/DIG. 72

[56] References Cited

U.S. PATENT DOCUMENTS

| | | | |
|---|---|---|---|
| 4,592,791 | 6/1986 | Nakajima et al. | 438/47 |
| 4,944,811 | 7/1990 | Sukegawa et al. | 438/47 |
| 5,061,643 | 10/1991 | Yagi | 438/47 |
| 5,093,696 | 3/1992 | Kinoshita | 438/47 |

FOREIGN PATENT DOCUMENTS

| | | |
|---|---|---|
| 5-63235 A | 3/1993 | Japan . |
| 5-243611 A | 9/1993 | Japan . |
| 6-252444 A | 9/1994 | Japan . |
| 07030150 A | 1/1995 | Japan . |
| 07038150 A | 2/1995 | Japan . |

*Primary Examiner*—Peter Toby Brown
*Assistant Examiner*—Long Pham
*Attorney, Agent, or Firm*—McDermott, Will & Emery

[57] ABSTRACT

A light-emitting diode having improved moisture resistance characteristics comprises a p-type gallium arsenide substrate and four epitaxial layers of $Al_xGa_{1-x}As$ (22, 23, 24 and 25). These epitaxial layers comprises an intervening layer (22) of p-type $Al_xGa_{1-x}As$, a cladding layer (23) of p-type $Al_{x2}Ga_{1-x2}As$, an active layer (24) of $Al_{x3}Ga_{1-x3}As$, and a window layer (25) of $Al_{x4}Ga_{1-x4}As$ so as to form a double-hetero structure, where x1, x2, x3 and x4 represent mixed crystal ratios of aluminum to arsenic of the layers, respectively, and meet the condition that:

$x2 \geq x4 > x1 \geq x3$ $(0 \leq x1, x2, x3, x4 \leq 1)$.

5 Claims, 3 Drawing Sheets

METHOD FOR MAKING LIGHT-EMITTING DIODE HAVING IMPROVED MOISTURE RESISTANCE CHARACTERISTICS

BACKGROUND OF THE INVENTION

This invention relates to a light-emitting diode and a method of manufacturing the same, and more particularly to a light-emitting diode having a hetero-junction of aluminum gallium arsenide structure and a method of manufacturing the same.

Compound semiconductor materials, such as gallium arsenide and aluminum gallium arsenide ($Al_xGa_{1-x}As$), have been widely used as a semiconductor light source, e.g., a light-emitting diode, etc. by utilizing their light-emitting function. For example, light-emitting diodes are made from a wafer which comprises a p-n junction formed by a plurality of epitaxial layers grown on a single crystal substrate by Liquid Phase Epitaxy (LPE), Metal Organic Vapor Phase Epitaxy (MOVPE), etc.

A conventional light-emitting diode having a double-hetero structure of $Al_xGa_{1-x}As$ ($0 \leq x \leq 1$) layers comprises a p-type gallium arsenide substrate, and three epitaxial layers of $Al_xGa_{1-x}As$, which are a cladding layer of p-type $Al_{x11}Ga_{1-x11}As$, an active layer of $Al_{x22}Ga_{1-x22}As$, and a window layer of $Al_{x33}Ga_{1-x33}As$. These epitaxial layers are formed on the substrate, in order, by growing from three different growth melts. In this case, the mixed crystal ratios of aluminum to arsenic x11, x22, x33 of the layers meet the condition that:

x11>x22; x33>x22.

While the ratio x22 may be determined depending on a desired wavelength, the ratios x11 and x33 are preferably determined so that the differences between x11 and x22, and between x33 and x22, i.e. x11−x22 and x33−x22 are as large as possible, in view of making injection of minority carriers more efficient by the hetero junction structure, and facilitating recombination of injected carriers caused by the confinement of the carriers.

For particular light-emitting diodes, such as a light-emitting diode lamp, the output power of such light-emitting diodes is preferably higher than that of other types of diodes. To obtain these characteristics, the aforementioned mixed crystal ratios of aluminum to arsenic x11 and x33 are necessarily higher. In the conventional light-emitting diode, however, there is a disadvantage in that such light-emitting diodes having higher mixed crystal ratios of aluminum to arsenic are more likely to be deteriorated under a highly moist environment. Because the higher the mixed crystal ratios of the epitaxial layers are, the more likely the epitaxial layers are to be oxidized under the environment. To solve this problem, for example, the light-emitting diode chip may be molded by a particular resin material having low moisture absorption characteristics. However, such a measure is still insufficient, because since a thinner layer of molding resin is required for a thin light-emitting diode lump, the more limited environments it can be applied to.

SUMMARY OF THE INVENTION

Accordingly, it is an object of the invention to provide a light-emitting diode in which the moisture-resistance characteristics thereof are improved while high output power thereof is maintained.

It is a further object of the invention to provide a method of manufacturing a light-emitting diode in which the process becomes easier and more cost-effective.

According to the first feature of the invention, a light-emitting diode having a plurality of hetero-junctions of aluminum gallium arsenide, comprises:

a substrate of p-type gallium arsenide;

an intervening layer of p-type $Al_{x1}Ga_{1-x1}As$ formed on the substrate;

a cladding layer of p-type $Al_{x2}Ga_{1-x2}As$ formed on the intervening layer;

an active layer of p-type $Al_{x3}Ga_{1-x3}As$ formed on the cladding layer; and a window layer of n-type $Al_{x4}Ga_{1-x4}As$ formed on the active layer;

wherein x1, x2, x3 and x4 represent mixed crystal ratios of aluminum to arsenic of the layers, respectively, and meet the condition that:

$x2 \geq x4 > x1 \geq x3 (0 \leq x1, x2, x3, x4 \leq 1)$.

According to the second feature of the invention, a method of manufacturing a light-emitting diode having a plurality of hetero-junctions of aluminum gallium arsenide layers, comprise the steps of:

epitaxially growing an intervening layer on a substrate of gallium arsenide from a first growth melt doped with at least one p-type dopant;

epitaxially growing a cladding layer on the intervening layer from a second growth melt doped with less than a predetermined amount of dopant;

epitaxially growing an active layer on the cladding layer from the first growth melt; and epitaxially growing a window layer on the active layer from the second growth melt, the second growth melt being subsequently doped with at least one n-type dopant after the growth of the intervening layer, the dopant being sufficient to turn the type of conductivity of the second growth melt into n-type;

wherein the at least one p-type dopant in the cladding layer is thermally diffused from the intervening layer by subsequent epitaxial growths of the active layer and the window layer so as to invert the initial type of conductivity of the cladding layer to p-type.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a light-emitting diode according to the first preferred embodiment, the aforementioned conventional light-emitting diode will be explained with reference to FIG. 1.

Figure 1:
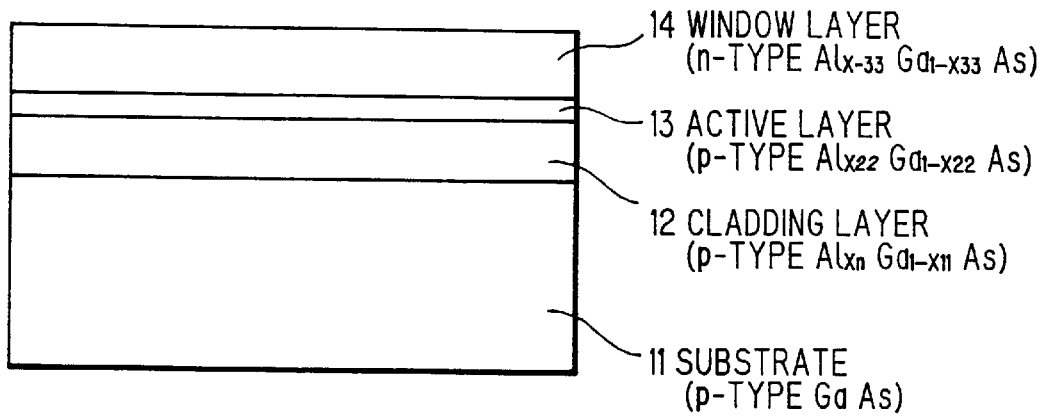
FIG. 1 is a cross-sectional view showing a conventional epitaxial wafer used for a light-emitting diode.

FIG. 1 shows the conventional epitaxial wafer used for a conventional light-emitting diode. As described before, this conventional light-emitting diode has a double-hetero structure of $Al_xGa_{1-x}As$ ($0 \leq x \leq 1$) layers 12, 13 and 14 on a p-type gallium arsenide substrate 11. It includes three epitaxial layers of $Al_xGa_{1-x}As$, i.e., a cladding layer 12 of p-type $Al_{x11}Ga_{1-x11}As$, an active layer 13 of $Al_{x22}Ga_{1-x22}As$, and a window layer 14 of $Al_{x33}Ga_{1-x33}As$. These epitaxial layers 12, 13 and 14 are formed on the substrate 11, in order, by growing from three different growth melts (not shown). In this case, the mixed crystal ratios of aluminum to arsenic x11, x22, x33 of the layers 12, 13 and 14 meet the condition that:

x11>x22, x33>x22.

For particular light-emitting diodes like a light-emitting diode lamp, the output power of the light-emitting diode is preferably higher. To obtain these characteristics, the aforementioned mixed crystal ratios of aluminum to arsenic x11 and x33 are necessarily higher. However, such a light-emitting diode having higher mixed crystal ratios of aluminum to arsenic are more likely to be deteriorated in a highly moist environment, which results in less reliability. Because the higher the mixed crystal ratios of the epitaxial layers are, the more likely the epitaxial layers are to be oxidized in such an environment, which makes the moisture-resistance characteristics of the light-emitting diode worse.

Figure 2:
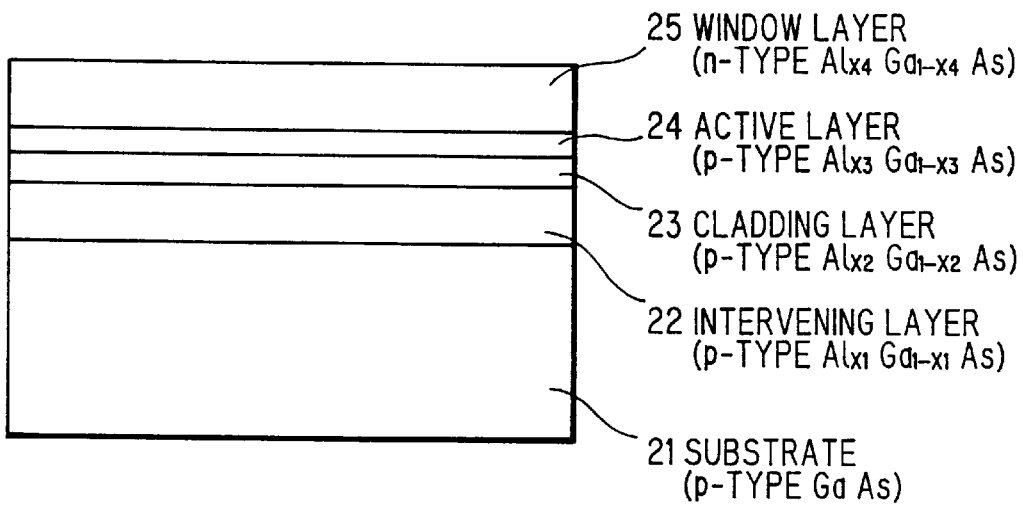
FIG. 2 is a cross-sectional view showing an epitaxial wafer used for a light-emitting diode in a preferred embodiment according to the invention.

Next, a light-emitting diode according to the preferred embodiment will be explained with reference to FIG. 2.

In the preferred embodiment, the wafer, from which the light-emitting diodes may be obtained, comprises a p-type gallium arsenide substrate 21, and four epitaxial layers of $Al_xGa_{1-x}As$ 22, 23, 24 and 25 which form a double-hetero structure. These epitaxial layers comprise an intervening layer 22 of p-type $Al_xGa_{1-x}As$ (first layer), a cladding layer 23 of p-type $Al_{x2}Ga_{1-x2}As$ (second layer), an active layer 24 of $Al_{x3}Ga_{1-x3}As$ (third layer), and a window layer 25 of $Al_{x4}Ga_{1-x4}As$ (fourth layer), where x1, x2, x3 and x4 represent mixed crystal ratios of aluminum to arsenic of the layers, respectively, and meet the condition that:

x2≧x4>x1≧x3(0≦x1, x2, x3, x4≦1).

Figure 3:
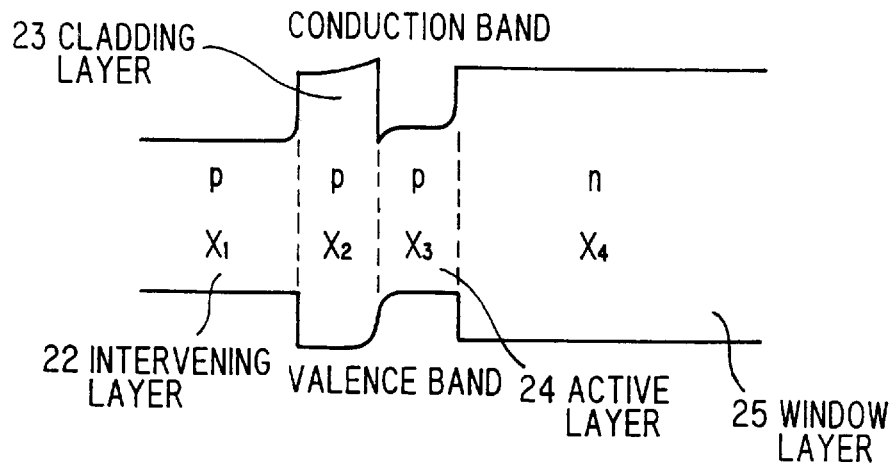
FIG. 3 is a diagram showing a band structure for the preferred embodiment according to the invention.

FIG. 3 shows a band structure of the light-emitting diode made from the above-mentioned epitaxial wafer. According to known junction theory, injected carriers are confined in the active layer 24 where the mixed crystal ratio thereof x3 is lower than those of other layers and the band gap thereof is narrower. Therefore, the probability of recombination of carriers in the active layer 24 becomes high and a highly efficient light-emitting is obtained. The bigger the differences between x3 and x2, and between x3 and x4 are (i.e., the higher x2 and x4 are), the more effective is the confinement effect of injected carriers. However, such layers that have higher mixed crystal ratios are likely to be oxidized, which results in deterioration of moisture proof characteristics and difficulty in forming an electrode thereon. Therefore, the ratios x2 and x4 should be less than about 0.6. On the other hand, the ratio x3 may be determined depending on a desired wavelength, for example, x3 is to be 0.35 for an operating wavelength of 660 nm. It is understood that the operating wavelength of the light-emitting diode may be determined by changing the mixed crystal ratio x3 of aluminum to arsenic of the active layer 24.

In the embodiment, the mixed crystal ratio of aluminum to arsenic of the intervening layer 22 (x1) is to be equal to or higher than that of active layer 24 (x3), and lower than that of cladding layer 23 (x2). As a result, oxidation under a highly moist environment is less likely to occur, while the specific band structure from the cladding layer 23 through the window layer 25 for confining carriers is still maintained. However, if the mixed crystal ratio of aluminum to arsenic of the intervening layer 22 (x1) becomes too high, less improvement of moisture proof characteristics is obtained.

In the embodiment, since the moisture proof characteristics are improved by the wafer structure itself, there is neither necessity to use a molding resin having low moisture absorption characteristics, nor to be subjected to restricted environmental conditions, even if a thinner device having a thinner molding package is required. Furthermore, since a double-hetero structure in the vicinity of the emitting portion is maintained in the embodiment, a high output power is also maintained.

In the invention, the thickness of the cladding layer 23 is preferably from 0.05~10 μm, and more preferably from 0.1~3 μm. If the cladding layer 23 is thicker than 10 μm, light-emitting diodes having regular light-emitting characteristics are hardly obtained. Furthermore, if it is thinner than 0.05 μm, sufficient output power is not obtained, which is empirically known to those having ordinary skill in the art. Therefore, it should be thicker than 0.05 μm so as to enhance the confinement effect of minority carriers by the hetero junction between the cladding layer 23 and the active layer 24. In the invention, p-type dopants added to the p-type layers may include zinc (Zn) and germanium (Ge), and n-type dopants may include tellurium (Te) and silicon (Si). Moreover, the p-type gallium arsenide substrate may be removed, and a reflective layer maybe formed instead of the p-type gallium arsenide substrate in order to obtain a back reflecting-type light-emitting diode.

Next, the method of manufacturing the epitaxial wafer in the aforementioned embodiment will be explained by the following examples.

(EXAMPLE 1)

FIG. 4 shows a flow diagram illustrating a method of manufacturing the epitaxial wafer according to the invention, wherein a jig for carrying out the method is employed. The jig is a slide boat made of high-purity graphite, which comprises a substrate holder 31 for accommodating a substrate 35, a first receptacle 32 for storing a first growth melt 36, a second receptacle 33 for storing a second growth melt 37, and an additional source holder 30 for temporarily storing an additional source 34. The additional source 34 will be added to the second growth melt 37 during the growth of epitaxial layers. The first growth melt 36 consists of a gallium (Ga) melt including 66 mg/gGa of polycrystalline gallium arsenide (GaAs), 2 mg/gGa of aluminum (Al), and 1 mg/gGa of zinc (Zn) as a p-type dopant. The second growth melt 37 consists of a gallium melt including 28 mg/gGa of polycrystalline gallium arsenide, and 2 mg/gGa of aluminum. The first and second growth melts 36, 37 are stored in the first and second receptacles of the slide boat, respectively. An n-type dopant of tellurium (Te) is stored in the additional source holder as the additional source 34. A zinc-doped p-type gallium arsenide single crystal substrate is used as the substrate 35 and placed on the substrate holder 31.

In this example, the first growth melt 36 is used for the growth of not only the intervening layer but also the active layer. In this case, however, if the concentration of carriers in the first growth melt 36 is too high, crystal defects in the active layer may increase, which results in the decrease of light-emitting output power. Therefore, the concentration in the intervening layer is preferably determined to be 0.8× $10^{18}/cm^3$–2× $10^{18}/cm^3$. This concentration is high enough to invert the conductivity type of the cladding layer having about 10 μm thickness into p-type.

Figure 4A:
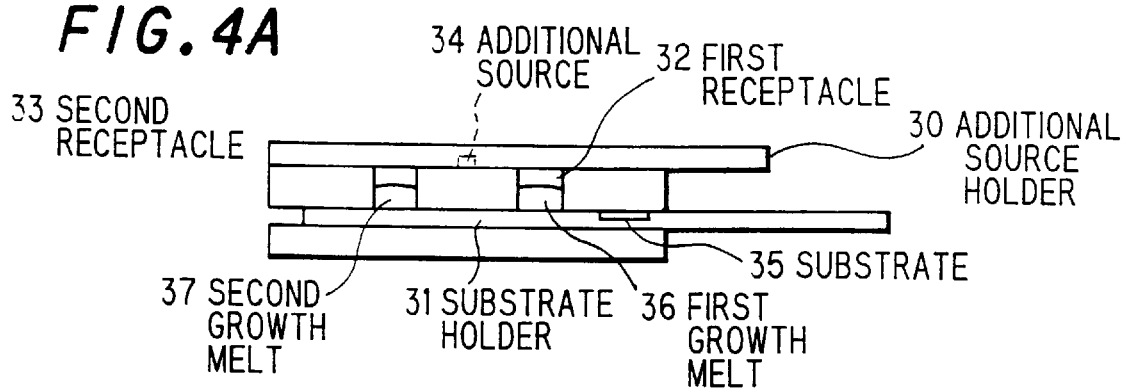
FIGS. 4A, 4B, 4C, 4D and 4E are flow diagrams showing a method of manufacturing the epitaxial wafer in a preferred embodiment according to the invention.

The slide boat is positioned in a quartz reaction chamber (not shown), where the air therein is first evacuated, and then hydrogen gas is supplied thereto. After that, the temperature in the reaction chamber is increased to 900° C. by an electric heater (not shown) and maintained. Then the polycrystalline gallium arsenide, aluminum and/or zinc are melted into the gallium melt in the first and second receptacles 31, 32, so that the first and second growth melts 36, 37 having predetermined compositions are respectively obtained. After uniform compositions of the first and second growth melt 36, 37 are obtained, both melts are gradually cooled at a predetermined cooling rate (FIG. 4A).

Figure 4B:
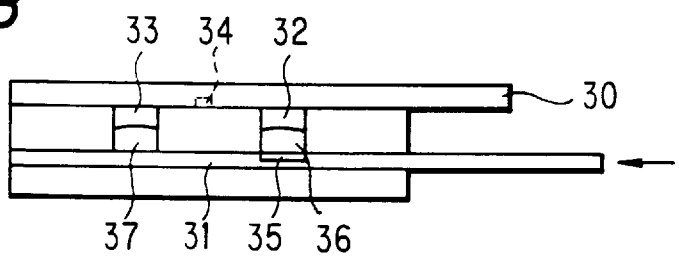
Figure 4C:
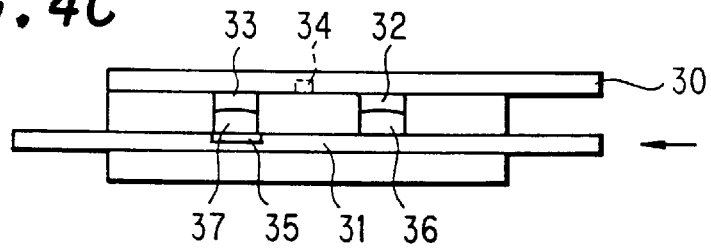

During the cooling, the substrate holder 31 is slid in a first direction (left-hand direction), so that the p-type gallium arsenide substrate 35 comes in contact with the first growth melt 36. Then, the intervening layer of p-type aluminum gallium arsenide having a thickness of about 20 $\mu$m is grown on the substrate 35 (FIG. 4B). In the same manner, the substrate holder 31 is further slid in the same direction so that the substrate 35 comes in contact with the second growth melt 37. Then the cladding layer of about 2 $\mu$m thick, which contains less than a predetermined amount of dopant, is grown on the intervening layer (FIG. 4C).

Figure 4D:
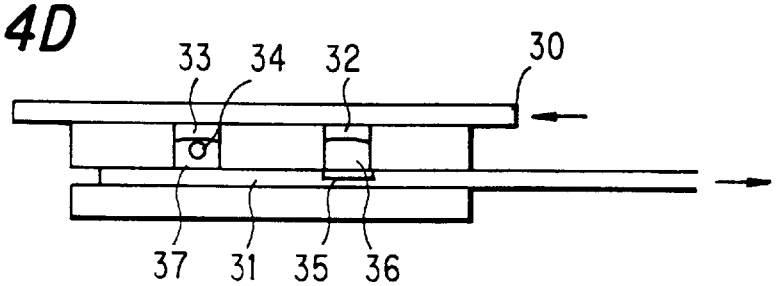
Figure 4E:
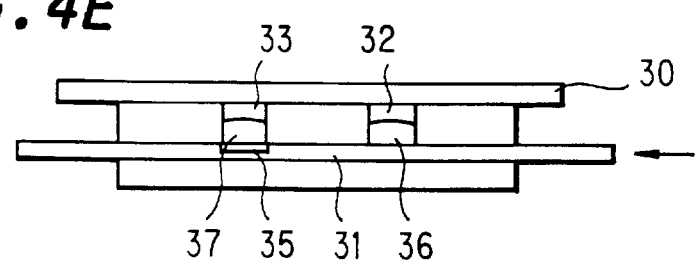

Next, the substrate holder 31 is slid in the opposite direction (right-hand direction) so that the substrate 35 again comes in contact with the first growth melt 36 on the substrate 35 an active layer of p-type aluminum gallium arsenide having a thickness of about 1 $\mu$m (FIG. 4D). On the other hand, after the growth of the cladding layer, the additional source 34 of the tellurium is added to the second growth melt 37 by sliding the additional source holder 30. Finally, after finishing the growth of the active layer, the substrate holder 31 is slid in the left-hand direction so that the substrate 35 comes in contact with the second growth melt 37 including tellurium. Then, the window layer of n-type aluminum gallium arsenide having a thickness of about 40 $\mu$m is grown on the active layer (FIG. 4E). As a result, an epitaxial wafer for a red light-emitting diode having four layers is obtained.

It is confirmed that the conductivity type of the cladding layer is p-type due to the diffusion of the zinc from the intervening layer during the growth of the active layer and the window layer, even if the initial conductivity type of the cladding layer does not include a substantial amount of (n-type or p-type) dopants. The concentration of p-type carriers in the intervening layer is about $1\times10^{18}$ cm$^{-3}$, which is high enough to result in making the cladding layer have almost the same concentration of p-type carriers as the intervening layer after thermal diffusion of the p-type carriers from the intervening layer. The concentration of p-type carriers in the active layer is about $1\times10^{18}$ cm$^{-3}$. On the other hand, the concentration of n-type carriers in the window layer is about $1\times10^{17}$ cm$^{-3}$, which equals the value in the vicinity of the interfaces between the active layer and the window layer, while that of n-type carriers in the vicinity of the surface (the opposite side to the interface) of the window layer is about $1\times10^{18}$ cm$^{-3}$.

Figure 5:
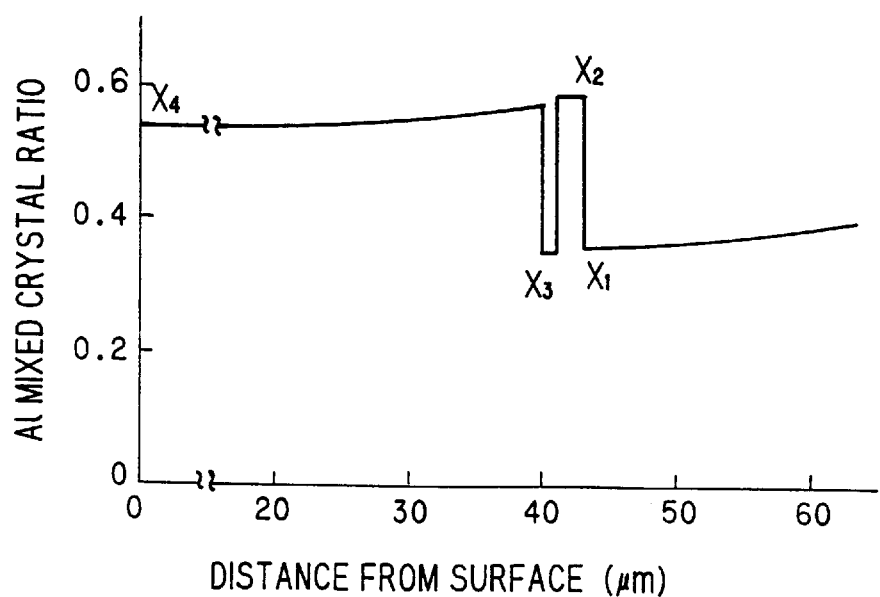
FIG. 5 is a graph showing a profile of mixed crystal ratio of aluminum to arsenic in the epitaxial wafer manufactured by the method according to the invention.

FIG. 5 shows the profile of a mixed crystal ratio of aluminum to arsenic of the epitaxial wafer obtained by the above-mentioned process. The mixed crystal ratio of the intervening layer x1 is 0.37, and those of the cladding layer, the active layer and the window layer x2, x3, x4 are 0.59, 0.35 and 0.55, respectively. In the graph, the profiles of the mixed crystal ratios x1 and x4 have a slope of about 0.03 from the beginning to the end of epitaxial growth due to the aforementioned gradual cooling process.

A light-emitting diode was made from the epitaxial wafer of the example. The brightness of the obtained light was about 2,000 mcd ($I_F$=20 mA, at initial characteristics), which is comparable with that of the conventional light-emitting diode having a three-layered double-hetero structure. Moreover, according to the moisture proof reliability test performed under condition where the temperature is 85° C., the humidity is 85% and $I_F$=30 mA for 1,000 loading hours, the end-of-test brightness relative brightness to the initial value was about 98%. This shows that the decrease of the brightness is less than with the conventional light-emitting diode molded in the same conditions, the relative brightness of which is about 70%.

(EXAMPLE 2)

An epitaxial wafer having the same structure is manufactured in the same manner as EXAMPLE 1, except for initially adding tellurium as an n-type dopant to the second growth melt so that an initially n-type cladding layer is obtained. In this example, it is also confirmed that the conductivity type of the cladding layer of the resulting light-emitting diode is inverted to p-type due to the diffusion of the zinc from the intervening layer during the growth of the active layer and the window layer. Furthermore, similar brightness characteristics to those of EXAMPLE 1 are obtained. The concentration of p-type carriers in the intervening layer is about $1\times10^{18}$ cm$^{-3}$, which is substantially higher than that of n-type dopant in the cladding layer so that the initial type of conductivity of said cladding layer, i.e., n-type is inverted to p-type. That is to say, the initial concentration of n-type carriers in the cladding layer is about $1\times10^{17}$ cm$^{-3}$, which equals the value in the vicinity of the interface between the active layer and the window layer. The concentration of p-type carriers in the intervening layer is so high (i.e. about $1\times10^{18}$ cm$^{-3}$) that the p-type carriers therein thermally diffuse in the cladding layer, which results in inverting the initial type of conductivity of the cladding layer to p-type. The resulting concentration of the p-type carriers in the cladding layer is almost equal to that in the intervening layer. Moreover, the concentrations of the carriers in the active and window layers are the same as those in EXAMPLE 1.

In these examples, the first and second growth melts are preferably used for forming four different epitaxial layers. However, it is understood that the light-emitting diode in the invention may be obtained by using four different growth melts.

(Comparison 1)

An epitaxial wafer having the same structure is manufactured in the same manner as EXAMPLES 1 and 2, except for the thickness of the cladding layer being 11 $\mu$m. In this comparison, however, an undesirable n-type conductivity region is generated in the vicinity of the interface between the cladding layer and the active layer. As a result, a light-emitting diode having normal characteristics is not obtained.

(Comparison 2)

An epitaxial wafer having the same structure is manufactured in the same manner as EXAMPLES 1 and 2, except for the thickness of the cladding layer being 0.04 $\mu$m. In this case, however, the brightness of the resulting light-emitting diode is about half of that of EXAMPLES 1 and 2. Therefore, normal characteristics are not obtained.

(Comparison 3)

An epitaxial wafer, the mixed crystal ratios x2, x3, x4 of which meet the condition that x4>x3≧x2, is manufactured.

The specific values of these ratios x2, x3, x4 are 0.03, 0.35, and 0.55, respectively. In this comparison, the confinement effect is reduced, such that the brightness of the light-emitting diode made from the wafer decreases to as low as 1,000 mcd ($I_F$=20 mA).

(Comparison 4)

Epitaxial wafers, the mixed crystal ratios x2, x3, x4 of which meet the condition that x2>x3≧x4 and x3>x4≧x2, respectively, are manufactured. The specific values of these ratios x2, x3, x4 are (a) x2=0.55, x3=0.35, x4=0.30 and (b) x2=0.30, x3=0.35, x4=0.30, respectively. In this comparison, no emission occurs because the light is absorbed by the window layer, the mixed crystal ratio x4 of which is smaller than that of the active layer x3.

(Comparison 5)

An epitaxial wafer, the mixed crystal ratios x2, x3, x4 of which are equal to each other (x2=x3=x4=0.35), is manufactured. In this comparison, the brightness of the light-emitting diode made from the wafer decreases to as low as 500 mcd ($I_F$=20 mA).

(Comparison 6)

An epitaxial wafer, the mixed crystal ratios x1, x2 of which meet the condition that x1≧x2, is manufactured. The specific values of these ratios x1, x2, x3 and x4 are 0.65, 0.59, 0.35 and 0.55, respectively. In this comparison, though the initial characteristics of brightness of the light-emitting diode made from the wafer is as high as about 2,000 mcd ($I_F$=20 mA), the resulting relative brightness after the humidity resistance test for 1000 loading hours is decreased as low as 70%.

Although the invention has been described with respect to specific embodiment for complete and clear disclosure, the appended claims are not to be thus limited, but are to be construed as embodying all modification and alternative constructions that may be occur to one skilled in the art which fairly fall within the basic teaching here is set forth.

We claim:

1. A method of manufacturing a light-emitting diode having a plurality of hetero-junctions comprising aluminum gallium arsenide layers, comprising the steps of:

epitaxially growing an intervening layer on a substrate of gallium arsenide from a first growth melt containing at least one p-type dopant;

epitaxially growing a cladding layer on said intervening layer from a second growth melt containing at least one n-type dopant, the concentration of said p-type dopant in said intervening layer being higher than that of said n-type dopant in said cladding layer;

epitaxially growing an active layer on said cladding layer from said first growth melt;

epitaxially growing an n-type window layer on said active layer from said second growth melt;

wherein said at least one p-type dopant in said intervening layer is thermally diffused from said intervening layer into said cladding layer by subsequent epitaxial growths of said active layer and said window layer so as to invert the n-type conductivity of said cladding layer to p-type.

2. A method of manufacturing a light-emitting diode, according to claim 1, wherein:

the thickness of said cladding layer is 0.05–10 micro meters.

3. A method of manufacturing a light-emitting diode having a plurality of hetero-junctions comprising aluminum gallium arsenide layers, comprising the steps of:

epitaxially growing a p-type intervening layer on a substrate of gallium arsenide from a first growth melt containing at least one p-type dopant;

epitaxially growing a cladding layer on said p-type intervening layer from a second growth melt;

epitaxially growing a p-type active layer on said cladding layer from said first growth melt; and epitaxially growing an n-type window layer on said p-type active layer from a third growth melt containing at least one n-type dopant;

wherein said cladding layer becomes of p-type conductivity due to thermal diffusion of said at least one p-type dopant from said p-type intervening layer into said cladding layer during the epitaxial growth steps of said p-type active layer and said n-type window layer.

4. A method of manufacturing a light-emitting diode, according to claim 3, wherein:

said third growth melt is prepared by adding said at least one n-type dopant into said second growth melt, after the epitaxial growth steps of said p-type intervening layer and said cladding layer.

5. A method of manufacturing a light-emitting diode, according to claim 3 wherein:

the thickness of said cladding layer is 0.05–10 micro meters.

* * * * *